(12) United States Patent
Chen et al.

(10) Patent No.: US 7,389,457 B2
(45) Date of Patent: Jun. 17, 2008

(54) SHIFT REGISTERS FREE OF TIMING RACE BOUNDARY SCAN REGISTERS WITH TWO-PHASE CLOCK CONTROL

(75) Inventors: Hsin-Ley Suzanne Chen, San Jose, CA (US); Patrick T. Chuang, Cupertino, CA (US); Michelle Huang, San Jose, CA (US)

(73) Assignees: Sony Corporation, Tokyo (JP); Sony Corporation, Inc., Park Ridge, NJ (US)

( * ) Notice: Subject to any disclaimer, the term of this patent is extended or adjusted under 35 U.S.C. 154(b) by 313 days.

(21) Appl. No.: 11/404,353

(22) Filed: Apr. 14, 2006

(65) Prior Publication Data
US 2007/0101222 A1    May 3, 2007

Related U.S. Application Data

(60) Provisional application No. 60/731,394, filed on Oct. 28, 2005.

(51) Int. Cl.
*G01R 31/28* (2006.01)
(52) U.S. Cl. ......................... 714/727; 714/731
(58) Field of Classification Search ................ 713/400; 327/218; 375/372, 354; 714/726, 729, 727, 714/731
See application file for complete search history.

(56) References Cited

U.S. PATENT DOCUMENTS 5,915,107 A * 6/1999 Maley et al. ................ 713/400
6,163,864 A * 12/2000 Bhavsar et al. .............. 714/727
6,642,763 B2 * 11/2003 Dike ........................... 327/202
6,836,144 B1 12/2004 Bui et al. ....................... 326/32
7,202,724 B2 * 4/2007 Kim ........................... 327/218
7,219,283 B2 * 5/2007 Whetsel ...................... 714/727
7,242,737 B2 * 7/2007 Lake et al. ................... 375/372
7,253,656 B2 8/2007 Costa et al. ................... 326/30
7,254,793 B2 * 8/2007 Chen et al. ..................... 716/5
7,317,773 B2 * 1/2008 Young et al. ................. 375/354
2005/0190640 A1 9/2005 Braceras et al. ............. 365/233

OTHER PUBLICATIONS

IEEE Standard 1149.1-2001, "IEEE Standard Test Access Port and Boundary-Scan Architecture", 2001, pp. i-200, printed in the United States of America.

* cited by examiner

*Primary Examiner*—David Ton
(74) *Attorney, Agent, or Firm*—Haverstock & Owens LLP

(57) ABSTRACT

A chain of boundary scan registers is configured to use a two-phase clock signal to avoid data timing race conditions. The two-phase clock signal is generated according to a two-phase clock generator, which includes two self-timed clock pulse generators for each boundary scan register. The two-phase clock generator locally generates a self-timed clock pulse at the rising edge of a clock signal, which triggers a first stage of the boundary scan register. The two-phase clock generator also generates a self-timed clock pulse at the falling edge of the input clock signal, which triggers a second stage of the boundary scan register. The two-phase clock controlled boundary scan register includes two latches, each latch is triggered by one of the self-timed clock pulse generated locally from the rising and falling edge of the input clock signal.

28 Claims, 3 Drawing Sheets

Data Racing

SHIFT REGISTERS FREE OF TIMING RACE BOUNDARY SCAN REGISTERS WITH TWO-PHASE CLOCK CONTROL

RELATED APPLICATIONS

This application claims priority of U.S. provisional application Ser. No. 60/731,394, filed Oct. 28, 2005, and entitled "SHIFT REGISTERS FREE OF TIMING RACE BOUNDARY SCAN REGISTERS WITH TWO-PHASE CLOCK CONTROL", by the same inventors. This application incorporates U.S. provisional application, Ser. No. 60/731,394, filed Oct. 28, 2005, and entitled "SHIFT REGISTERS FREE OF TIMING RACE BOUNDARY SCAN REGISTERS WITH TWO-PHASE CLOCK CONTROL", in its entirety by reference.

FIELD OF THE INVENTION

The present invention relates to the field of data registers. More particularly, the present invention relates to the field boundary scan registers configured to eliminate data racing conditions.

BACKGROUND OF THE INVENTION

Historically, most printed circuit board (PCB) testing was done using in-circuit test equipment. Recent advances with VLSI technology now enable microprocessors and Application Specific Integrated Circuits (ASICs) to be packaged into fine pitch, high count packages. These high density devices pose unique manufacturing challenges, such as the accessibility of test points and the high cost of test equipment.

Boundary scan testing was developed as the JTAG (Joint Test Access Group) interface, and formalized as the IEEE 1149.1 standard, to solve the physical access problems on PCBs caused by increasingly crowded assemblies due to the dense packaging technologies. Boundary scan embeds test circuitry at the chip level to form a complete board-level test protocol. With boundary scan, even the most complex assemblies can be accessed for testing, debugging, in-system device programming, and for diagnosing hardware problems.

Boundary scan is a methodology allowing complete control and observation of the boundary pins of an IEEE 1149.1 compatible device via software control. The IEEE 1149.1 standard defines a four-wire serial interface used to access complex integrated circuits (ICs) such as microprocessors, Digital Signal Processors (DSPs), Application Specific Integrated Circuits (ASICs), and Complex Programmable Logic Devices (CPLDs). An on-chip test bus circuitry that complies with the IEEE 1149.1 standard includes boundary scan registers and a test access port (TAP) controller to execute the boundary scan functions. The TAP controller is a finite-state machine that decodes the state of the bus.

The boundary scan bus circuitry consists of the boundary scan registers, a 1-bit bypass register, an instruction register, several miscellaneous registers, and the TAP controller. The boundary scan bus consists of a test clock signal (TCK) pin, a test mode signal (TMS) pin, a test data in (TDI) line, a test data out (TDO) line, and a test reset (TRST) pin.

The TCK pin and the TMS pin direct signals between the TAP controller states. The TDI pin and the TDO pin receive the data input and output signals, respectively, for the boundary scan register chain. Optionally, a fifth pin, TRST, can be implemented as an asynchronous reset signal to the TAP controller.

During standard operations, the boundary scan registers are inactive and allow data to be propagated through the boundary scan device normally. During test modes, all input signals are captured for analysis and all output signals are preset to test down-string devices. The operation of these boundary scan registers are controlled through the TAP Controller and an instruction register.

Test instructions and test data are sent to a chip over the TDI line. Test results and status information are sent from a chip over the TDO line. This information is transmitted serially. Control of the boundary scan bus circuitry is carried out by the TAP controller, which responds to the state transitions on the TMS line. The boundary scan logic is clocked by the TCK signal.

The boundary scan registers are configured as a chain. A first boundary scan register in the chain is driven by the TDI line, and the last boundary scan register drives the TDO line. The instruction register provides the specific instructions related to the type of test that is to be performed. The IEEE 1149.1 Standard requires that all compliant devices must perform the EXTEST instruction, the SAMPLE/PRELOAD instruction, and the BYPASS instruction. The EXTEST instruction performs a PCB interconnect test. The EXTEST instruction places an IEEE 1149.1 compliant device into an external boundary test mode and selects the boundary scan register to be connected between the TDI pin and the TDO pin. During this instruction, the boundary scan registers associated with the outputs are preloaded with test patterns to test downstream devices. The input boundary scan registers are set up to capture the input data for later analysis. The SAMPLE/PRELOAD instruction allows an IEEE 1149.1 compliant device to remain in its functional mode and selects the boundary scan register to be connected between the TDI pin and the TDO pin. During this instruction, the boundary scan register can be accessed via a data scan operation to take a sample of the functional data entering and leaving the device. This instruction is also used to preload test data into the boundary scan registers prior to loading an EXTEST instruction. A boundary scan register chain can be skipped using the BYPASS instruction, allowing the data to pass through the bypass register. The BYPASS instruction allows an IEEE 1149.1 compliant device to remain in a functional mode and selects the bypass register to be connected between the TDI pin and the TDO pin. The BYPASS instruction allows serial data to be transferred through a device from the TDI pin to the TDO pin without affecting the operation of the device.

Multiple scan-compatible ICs may be serially interconnected on the PCB, forming one or more boundary scan chains, each chain having its own TAP. Each scan chain provides electrical access from the serial TAP interface to every pin on every IC that is part of the chain. In normal operation, the IC performs its intended function as though the boundary scan circuits were not present. However, when the device's scan logic is activated for the purpose of testing or in-system programming, data can be sent to the IC and read from it using the serial interface. This data may be used to stimulate the device core, drive signals outward from the device pins to the PCB, sense the input pins from the PCB, and sense the device outputs.

The boundary scan registers are located close to the pad area of the chip under test. Due to physical constraints of the printed circuit board, a boundary scan device, and its boundary scan registers, can not always be located as close to the pin under test as is optimal. Further, the circuit path length from the pin under test to each boundary scan register varies in length, which results in delay. Other factors also contribute to incongruent delay, such as temperature. Further, the clock signal that triggers a particular boundary scan register is generated from the TAP controller, and distributed to the boundary scan registers. For ideal boundary scan register path design, any data delay from one boundary scan register to another should match the clock skew between registers, so that the boundary scan register does not receive the wrong data. However, in practice the order of data transmission does not track with the clock distribution path. To overcome this disparity, a delay can be inserted on the data path between two boundary scan registers. Accounting for such delays though, across all temperature and process variations, is difficult and burdensome. Moreover, for a high-capacity chip, which has many I/O and control pins, there are many different boundary scan register paths to consider.

FIG. 1 illustrates a conventional chain of two boundary scan registers configured according to ideal conditions. A boundary scan register FFn and a boundary scan register FFn+1 are configured in series such that an output from the boundary scan register FFn is provided as an input to the boundary scan register FFn+1. The conventional chain is configured such that a one-phase clock signal is provided as the clock input signal cktst to each of the boundary scan registers in the chain, including the boundary scan register FFn and the boundary scan register FFn+1. In the ideal case illustrated in FIG. 1, there is no clock signal delay between the clock signal received by the boundary scan register FFn and the boundary scan register Ffn+1. Accordingly, data racing does not occur. The ideal case also represents those occurrences where the clock skew between the two boundary scan registers FFn and FFn+1 is less than the value tKQ plus data line delay, where the value tKQ represents the time delay of the boundary scan register FFn to provide the data to the boundary scan register FFn+1.

FIG. 2 illustrates the waveforms associated with the boundary scan registers configured according to FIG. 1. The boundary scan register FFn latches the data 1*a* received at the input D of the register FFn. At the rising edge of the clock signal cktst, the data 1*a* latched by the boundary scan register FFn is provided at the output Q of the boundary scan register FFn, illustrated as Q(FFn) in FIG. 2. The boundary scan register FFn+1 latches the data Q(FFn) as data 2*a*. At the rising edge of the clock signal cktst, the data 2*a* latched by the boundary scan register FFn+1 is provided at the output Q of the boundary scan register FFn+1, illustrated as Q(FFn+1). The ideal boundary scan register chain shown in FIG. 1 successfully shifts data from cycle to cycle. However, under normal configurations and operating conditions, significant delays are introduced whereby data racing problems occur.

FIG. 3 illustrates a chain of two conventional boundary scan registers in which timing delays result in data racing. FIG. 4 illustrates the waveforms associated with the chain of boundary scan registers illustrated in FIG. 3. If the clock skew between the two boundary scan registers is larger than the delay tKQ of the boundary scan register FFn plus the data line delay, then the data 1*a* which should be latched by the boundary scan register FFn+1 at the second cycle, is instead latched at the first cycle. This results in a data timing race problem. If the clock signal cktstn+1 provided to the boundary scan register FFn+1 is delayed enough, then when the data is output from the boundary scan register FFn to the boundary scan register FFn+1, the data simply flows through the boundary scan register FFn+1 as long as the clock signal cktstn+1 is high. Racing problems occur because the clock distribution path is usually not tracking with the data transmitting path. This problem cannot be resolved even when the system cycle time TCK is relaxed. Data racing can be fixed by adding a delay on the data path. However, it is difficult to match the transistor delay to the metal wire RC delay in all process corners, power supply levels and temperatures. Matching these delays significantly increases the overhead.

SUMMARY OF THE INVENTION

A chain of boundary scan registers is configured to use a two-phase clock signal to avoid data timing race conditions. The two-phase clock signal is generated according to a two-phase clock generator, which includes two self-timed clock pulse generators for each boundary scan register. The two-phase clock generator locally generates a self-timed clock pulse at the rising edge of a clock signal, which triggers a first stage of the boundary scan register. The two-phase clock generator also generates a self-timed clock pulse at the falling edge of the input clock signal, which triggers a second stage of the boundary scan register. The two-phase clock controlled boundary scan register includes two latches, each latch is triggered by one of the self-timed clock pulse generated locally from the rising and falling edge of the input clock signal.

The two-phase clock generator includes a first self-timed clock pulse generator and a second self-timed clock pulse generator. The first self-timed clock pulse generator generates a first clock pulse at the rising edge of the input clock signal. The first clock pulse is provided to a first latch of the boundary scan register. The second self-timed clock pulse generator generates a second clock pulse at the falling edge of the input clock signal. The second clock pulse is provided to a second latch of the boundary scan register. Data received by the boundary scan register is latched in the first latch during the first half cycle of the input clock signal. During the first half cycle, the data is blocked by the second latch. The second latch does not latch the data until the second half of the cycle. Two or more boundary scan registers are coupled in series such that data output from the second latch of the first boundary scan register is input to the first latch of a second boundary scan register.

In one aspect, a chain of boundary scan registers includes a first boundary scan register and a second boundary scan register. The first boundary scan register is configured to receive a first clock signal, to latch a first input data value at a rising edge of the first clock signal, to prevent the first data value from being output prior to a falling edge of the first clock signal, and to output the first data value at the falling edge of the first clock signal. The second boundary scan register is coupled to the first boundary scan register and is configured to receive a second clock signal delayed relative to the first clock signal, to latch the first data value at a rising edge of the second clock signal, to prevent the first data value from being output prior to a falling edge of the second clock signal, and to output the first data value at the falling edge of the second clock signal. The chain of boundary scan registers includes N boundary scan registers coupled in series. A system clock signal can be configured such that a relative delay between the first clock signal and the second clock signal is less than one-half the cycle time of the system clock signal. The chain of boundary scan registers can also include a first pulse signal generator configured to receive the first clock signal and to generate a first pulse signal in response to the rising edge of the first clock signal. The chain of boundary scan registers can also include a second pulse signal generator configured to receive the first clock signal and to generate a second pulse signal in response to the falling edge of the first clock signal. The first boundary scan register can comprise a first latch coupled to the first pulse signal generator and a second latch coupled to the second pulse signal generator. The first latch can be configured to receive the first pulse signal, to latch the first data value in response to the first pulse signal, and to output the first data value. The second latch can be coupled to the first latch and is configured to receive the second pulse signal, to latch the first data value output from the first latch in response to the second pulse signal, and to output the first data value. The chain of boundary scan registers can also include a third pulse signal generator configured to receive the second clock signal and to generate a third pulse signal in response to the rising edge of the second clock signal. The chain of boundary scan registers can also include a fourth pulse signal generator configured to receive the second clock signal and to generate a third pulse signal in response to the falling edge of the second clock signal. The second boundary scan register can comprise a third latch coupled to the third pulse signal generator and a fourth latch coupled to the fourth pulse signal generator. The third latch can be configured to receive the third pulse signal, to latch the first data value in response to the third pulse signal, and to output the first data value. The fourth latch can be coupled to the third latch and is configured to receive the fourth pulse signal, to latch the first data value output from the third latch in response to the fourth pulse signal, and to output the first data value.

In another aspect, a boundary scan register is configured to input and output data according to a system clock signal. The boundary scan register includes a first pulse signal generator configured to receive the system clock signal and to generate a first pulse signal in response to a rising edge of the system clock signal, a second pulse signal generator configured to receive the system clock signal and to generate a second pulse signal in response to a falling edge of the system clock signal, a first latch coupled to the first pulse signal generator and configured to receive the first pulse signal, to latch an input data value in response to the first pulse signal forming a first latched data value, and to output the first latched data value, and a second latch coupled to the second pulse signal generator and configured to receive the second pulse signal, to latch the first latched data value output from the first latch in response to the second pulse signal forming a second latched data value, and to output the second latched data value.

In yet another aspect, a method of passing data through a chain of boundary scan registers is described. The method includes receiving a first clock signal at a first boundary scan register, receiving a second clock signal at a second boundary scan register, wherein the second clock signal is delayed relative to the first clock signal, latching a first input data value by the first boundary scan register at a rising edge of the first clock signal, preventing the first data value from being output from the first boundary scan register prior to a falling edge of the first clock signal, outputting the first data value from the first boundary scan register at the falling edge of the first clock signal, latching the first data value output from the first boundary scan register by the second boundary scan register, wherein latching by the second boundary scan register is performed at a rising edge of the second clock signal, preventing the first data value from being output from the second boundary scan register prior to a falling edge of the second clock signal, and outputting the first data value from the second boundary scan register at the falling edge of the second clock signal. The method can also include coupling N boundary scan registers together in series. The method can also include configuring a system clock signal such that a relative delay between the first clock signal and the second clock signal is less than one-half the cycle time of the system clock signal. The method can also include generating a first pulse signal in response to the rising edge of the first clock signal. The method can also include generating a second pulse signal in response to the falling edge of the first clock signal. The method can also include latching the first data value by a first latch in the first boundary scan register in response to the first pulse signal while preventing the first data value from being output from the first boundary scan register. The method can also include latching the first data value by a second latch in the first boundary scan register in response to the second pulse signal. Outputting the first data value from the first boundary scan register can comprise outputting the first data value from the second latch. The method can also include generating a third pulse signal in response to the rising edge of the second clock signal. The method can also include generating a fourth pulse signal in response to the falling edge of the second clock signal. The method can also include latching the first data value by a third latch in the second boundary scan register in response to the third pulse signal while preventing the first data from being output from the second boundary scan register. The method can also include latching the first data value by a fourth latch in the second boundary scan register in response to the fourth pulse signal. Outputting the first data value from the second boundary scan register comprises outputting the first data value from the fourth latch.

In another aspect, a method of passing an input data value through a boundary scan register is described. The method includes receiving a system clock signal, generating a first pulse signal in response to a rising edge of the system clock signal, latching the input data value in response to the first pulse signal at a first latch within the boundary scan register, while preventing the input data value from being output from the first latch, generating a second pulse signal in response to a falling edge of the system clock signal, latching the input data value in response to the second pulse signal at a second latch within the boundary scan register, and providing as an output the input data value from the boundary scan register

BRIEF DESCRIPTION OF THE DRAWINGS

Embodiments of the boundary scan registers are described relative to the several views of the drawings. Where appropriate and only where identical elements are disclosed and shown in more than one drawing, the same reference numeral will be used to represent such identical elements.

DETAILED DESCRIPTION OF THE EMBODIMENTS

Figure 5:
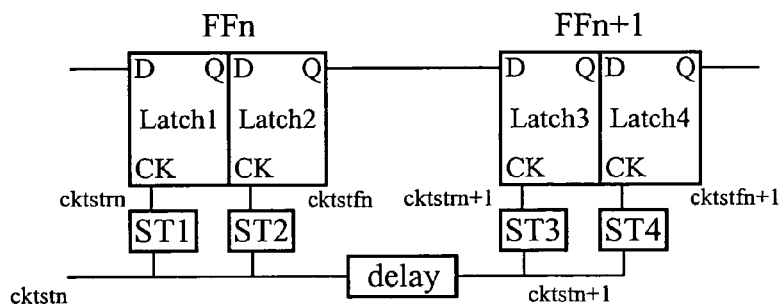
FIG. 5 illustrates a chain of two boundary scan registers configured according to a two-phase clock signal.

FIG. 5 illustrates a chain of two boundary scan registers configured according to the two-phase clock signal. A first boundary scan register FFn includes a latch 1 and a latch 2. A second boundary scan register FFn+1 includes a latch 3 and a latch 4. Each latch receives data at the input D, outputs data at the output Q, and receives a clock signal at the clock input CK. A self-timed pulse generator is coupled to the clock input of each latch. As shown in FIG. 5, a self-timed pulse generator ST1 is coupled to the clock input of the latch 1. A self-timed clock pulse generator ST2 is coupled to the clock input of the latch 2. A self-timed pulse generator ST3 is coupled to the clock input of the latch 3. A self-timed pulse generator ST4 is coupled to the clock input of the latch 4. The delay box shown in the clock input signal path represents the inherent delay associated with any physical signal path. The clock signal cktstn is the system clock signal TCK plus any delay associated with transmitting the signal TCK to the boundary scan register FFn. The clock signal cktstn+1 is the clock signal cktstn plus the relative delay associated with transmitting the clock signal cktstn from the boundary scan register FFn to the boundary scan register FFn+1. It is to be understood that more than two boundary scan registers can be chained together in this manner.

Figure 6:
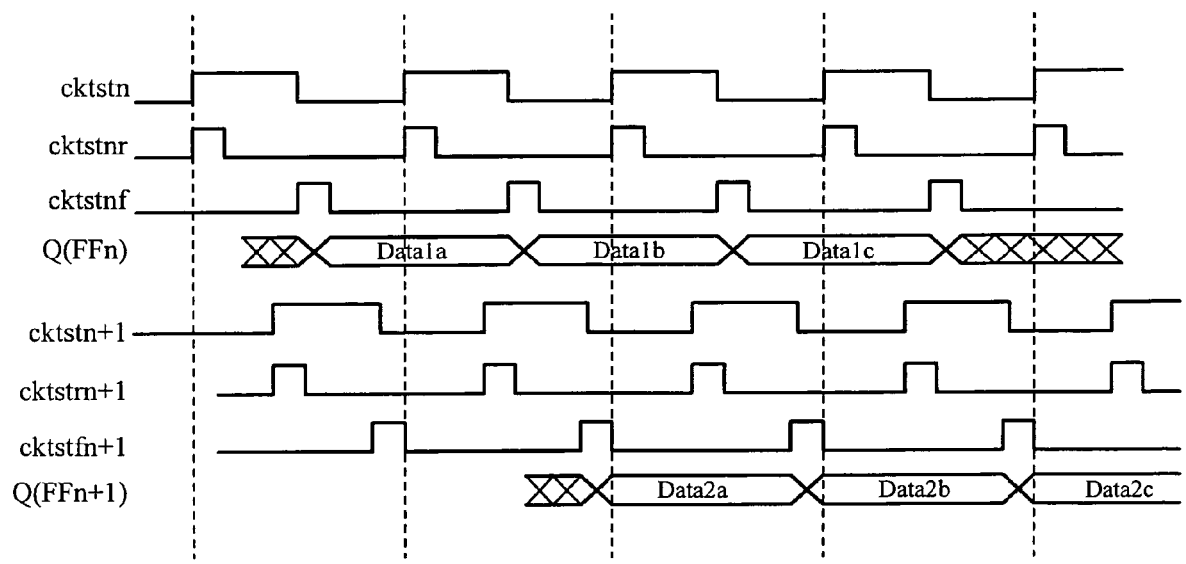
FIG. 6 illustrates the waveforms associated with the chain of boundary scan registers illustrated in the FIG. 5.

FIG. 6 illustrates the waveforms associated with the chain of boundary scan registers illustrated in the FIG. 5. The clock signal cktsn is received by the pulse generator ST1 and the pulse generator ST2. The clock signal cktstn+1 is received by the pulse generator ST3 and the pulse generator ST4. As shown in FIG. 6, the clock signal cktstn+1 is delayed relative to the clock signal cktstn. The pulse generator ST1 generates a pulse at the rising edge of the clock signal cktstn. The clock signal cktstrn represents the pulses generated by the pulse generator ST1. The clock signal cktstrn is received as the clock input CK to the latch 1 of the boundary scan register FFn. In response to receiving the pulse of the clock signal cktstrn, the latch 1 latches the data 1a received at the input D of the latch 1 of the boundary scan register FFn. The data 1a remains latched in the latch 1 and is not overwritten until the next pulse in the clock signal cktstrn.

At the falling edge of the clock signal cktstn, the pulse generator ST2 generates a pulse. The clock signal cktstfn represents the pulses generated by the pulse generator ST2. The clock signal cktstfn is received as the clock input CK to the latch 2 of the boundary scan register FFn. In response to receiving the pulse in the clock signal cktstfn, the latch 2 latches the data received at the input D from the output Q of latch 1, and outputs the data to the first latch (latch 3) of the next boundary scan register FFn+1. The data 1a is output from the latch 2 of the boundary scan register FFn at the output Q, as is shown in FIG. 6, as the data signal Q(FFn). In other words, the latch 2 prevents the data 1a received by latch 1 from being transmitted to the boundary scan register FFn+1 during the first half of the clock cycle, and the latch 2 becomes transparent at the falling edge of the clock cycle, thereby enabling the data 1a to be transmitted from the boundary scan register FFn to the boundary scan register FFn+1.

At the next rising edge of the clock signal cktstn, a next pulse is generated by the pulse generator ST1. The next pulse signals the latch 1 to latch the next data 1b, thereby overwriting the data 1a in the latch 1.

The clock signal cktstn+1 is received by the pulse generator ST3 and the pulse generator ST4. The pulse generator ST3 generates a pulse at the rising edge of the clock signal cktstn+1. The clock signal cktstrn+1 represents the pulses generated by the pulse generator ST3. The clock signal cktstrn+1 is received as the clock input CK to the latch 3 of the boundary scan register FFn+1. In response to receiving the pulse in the clock signal cktstrn+1, the latch 3 receives the data 1a from the boundary scan register FFn at the input D and latches the data as data 2a. The data 2a remains latched in the latch 3 and is not overwritten until the next pulse in the clock signal cktstrn+1.

At the falling edge of the clock signal cktstn+1, the pulse generator ST4 generates a pulse. The clock signal cktstfn+1 represents the pulses generated by the pulse generator ST4. The clock signal cktstfn+1 is received as the clock input CK to the latch 4 of the boundary scan register FFn+1. In response to receiving the pulse in the clock signal cktstfn+1, the latch 4 latches the data 2a received at the input D from the output Q of the latch 3, and outputs the data 2a to a next boundary scan register in the chain, if there is one. The data 2a is output from the latch 4 of the boundary scan register FFn+1 at the output Q, as is shown in FIG. 6, as the data signal Q(FFn+1). In other words, the latch 4 prevents the data received by the latch 3 from being transmitted to the next boundary scan register during the first half of the clock cycle, and the latch 4 becomes transparent at the falling edge of the clock cycle, thereby enabling the data to be transmitted from the boundary scan register FFn+1 to the next boundary scan register.

At the next rising edge of the clock signal cktstn+1, a next pulse is generated by the pulse generator ST3. The next pulse signals the latch 3 to latch the next data 2b, thereby overwriting the data 2a in the latch 3.

In operation, data is output from the boundary scan register FFn at the falling edge of the clock cycle cktstn, as signaled by the pulse generated by the pulse generator ST2. The boundary scan register FFn+1 captures the data output from the boundary scan register FFn at the next rising edge of the clock signal cktstn+1, as signaled by the pulse generated by the pulse generator ST3. However, the boundary scan register FFn+1 does not output the captured data until the falling edge of the next cycle of the clock signal cktstn+1, as signaled by the pulse generated by the pulse generator ST4. Such a configuration prevents the boundary scan register FFn+1 from outputting the data early, where the delay is less than one-half the system clock cycle.

Figure 4:
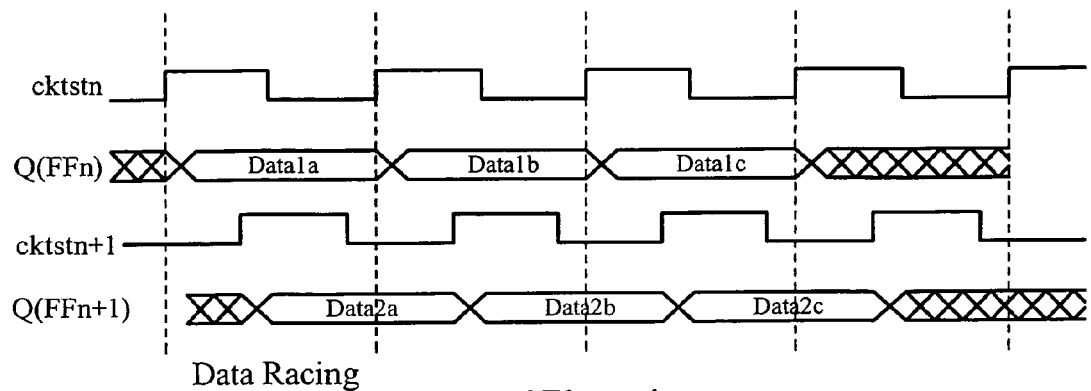
FIG. 4 illustrates the waveforms associated with the chain of boundary scan registers illustrated in FIG. 3.

The following equations describe the condition under which data racing is avoided. Two cases are considered for both the conventional boundary scan register chain, which is configured to operate according to the one-phase clock signal, and the dual-latch boundary scan register chain, which is configured to operate according to the two-phase clock signal. Case 1 refers to the condition where the clock signal cktstn+1 is delayed relative to the clock signal cktstn. FIGS. 4 and 6 illustrate examples of case 1. The term negative skew is used in the context of case 1 and refers to the time delay between the clock signal cktstn and the clock signal cktstn+1. Case 2 refers to the condition where the clock signal cktstn is delayed relative to clock signal cktstn+1. The term positive skew is the time delay between the clock signal cktstn+1 and the clock signal cktstn. The following variables are used:

| | |
|---|---|
| tnsk1 | Negative skew (between FFn and FFn+1) for the 1-phase clock signal |
| tpsk1 | Positive skew (between FFn and FFn+1) for the 1-phase clock signal |
| tnsk2 | Negative skew (between FFn and FFn+1) for the 2-phase clock signal |
| tpsk2 | Positive skew (between FFn and FFn+1) for the 2-phase clock signal |
| tKQ_RC | FF tKQ and RC delay between FFn and FFn+1 |
| tPW | Self-timed clock pulse width for the 2-phase clock signal |
| tCYC | Minimum cycle time |

Figure 1:
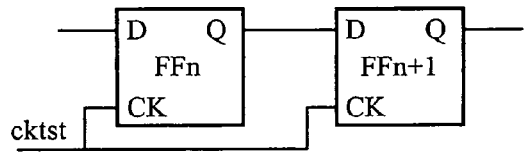
FIG. 1 illustrates a conventional chain of two boundary scan registers configured according to ideal conditions.
Figure 2:
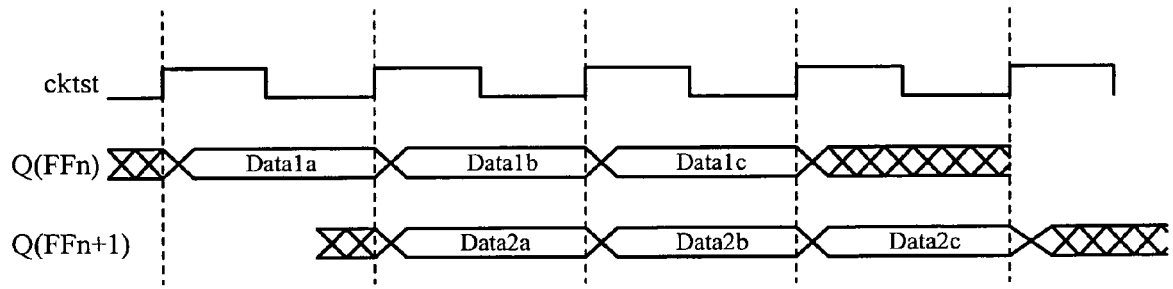
FIG. 2 illustrates the waveforms associated with the boundary scan registers configured according to FIG. 1.
Figure 3:
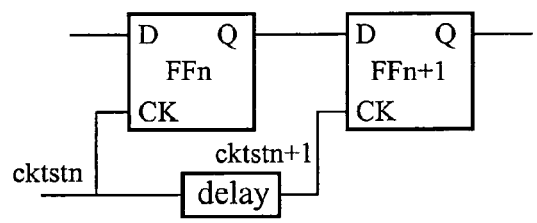
FIG. 3 illustrates a chain of two conventional boundary scan registers in which timing delays result in data racing.

For the boundary scan register chain configured according to the one-cycle clock signal, as shown in FIGS. 3 and 4, data racing is avoided when:

| Case 1: | $tCYC - tnsk1 > tKQ\_RC$ |
| --- | --- |
| | $\Rightarrow tnsk1 < tCYC - tKQ\_RC$ |
| Case 2: | $tpsk1 < tKQ\_RC$ |

For the boundary scan register chain configured according to the two-cycle clock signal, as shown in FIGS. 5 and 6, data racing is avoided when:

| Case 1: | $tCYC*0.5 - tKQ\_RC > tnsk2$ |
| --- | --- |
| | $\Rightarrow tCYC*0.5 > tnsk2 + tKQ\_RC$ |
| | $\Rightarrow tnsk2 < tCYC*0.5 - tKQ\_RC$ |
| Case 2: | $tpsk2 < tCYC*0.5 + tKQ\_RC - tPW$ |
| | $\Rightarrow tCYC*0.5 > tpsk2 + tPW - tKQ\_RC$ |

As applied to the chain of boundary scan registers described above in relation to FIGS. 5 and 6, if the clock skew of two boundary scan registers fails to meet the requirement for avoiding data racing, then the system cycle time, tCYC, can be increased to fix this problem.

Figure 7:
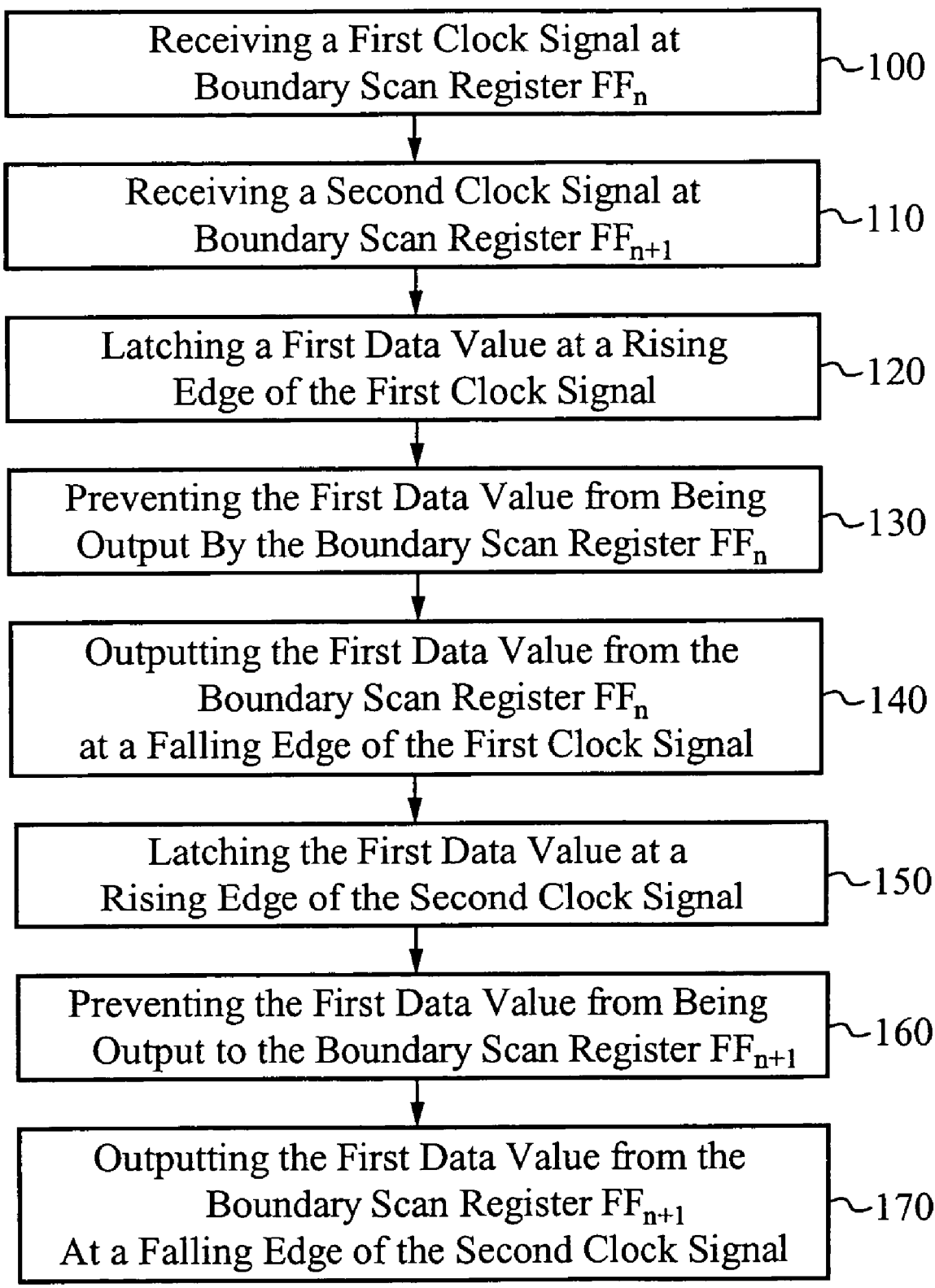
FIG. 7 illustrates a method of passing data through a chain of boundary scan registers configured to operate according to a two-phase clock signal.

FIG. 7 illustrates a method of passing data through a chain of boundary scan registers configured to operate according to a two-phase clock signal. At the step 100, a first clock signal is received by a boundary scan register FFn. At the step 110, a second clock signal is received by a boundary scan register FFn+1. The second clock signal is delayed relative to the first clock signal. At the step 120, a first data value is latched by the boundary scan register FFn at a rising edge of the first clock signal. At the step 130, the first data value is prevented from being output by the boundary scan register FFn prior to a falling edge of the first clock signal. In one embodiment, the first data value is prevented from being output by the boundary scan register FFn by configuring the boundary scan register FFn with two separate latches. The first latch receives the first data value as input to the boundary scan register FFn. The second latch is coupled to receive the output from the first latch. The first latch is configured to latch the first data value at the rising edge of the first clock signal, while the second latch is not, thereby preventing the first data value latched by the first latch from being output to the second latch while the first clock signal is high.

At the step 140, the first data value is output from the boundary scan register FFn at the falling edge of the first clock signal. At the step 150, the first data value output from the boundary scan register FFn is latched as an input by the boundary scan register FFn+1. The latching is performed at a rising edge of the second clock signal. At the step 160, the first data value is prevented from being output from the boundary scan register FFn+1 prior to a falling edge of the second clock signal. In one embodiment, the first data value is prevented from being output from the boundary scan register FFn+1 by configuring the boundary scan register FFn+1 with two separate latches. The first latch receives the first data value output from the second latch of the boundary scan register FFn as input to the boundary scan register FFn+1. The second latch of the boundary scan register FFn+1 is coupled to receive the output from the first latch of the boundary scan register FFn+1. The first latch is configured to latch the first data value at the rising edge of the second clock signal, while the second latch is not, thereby preventing the first data value latched by the first latch from being output to the second latch while the second clock signal is high. At the step 170, the first data value from the boundary scan register FFn+1 is output at the falling edge of the second clock signal.

Using the boundary scan register chain as described above, it is not necessary to simulate the detailed setup and hold time of the boundary scan registers across all process corners, power supply levels, and temperature conditions. A dual-latch boundary scan register utilizing a two-phase clock signal is more tolerant of arbitrary layout drawings, and saves design and post layout simulation time.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A chain of boundary scan registers comprising:
a first boundary scan register configured to receive a first clock signal, to latch a first input data value at a rising edge of the first clock signal, to prevent the first data value from being output prior to a falling edge of the first clock signal, and to output the first data value at the falling edge of the first clock signal; and
a second boundary scan register coupled to the first boundary scan register and configured to receive a second clock signal delayed relative to the first clock signal, to latch the first data value at a rising edge of the second clock signal, to prevent the first data value from being output prior to a falling edge of the second clock signal, and to output the first data value at the falling edge of the second clock signal.

2. The chain of boundary scan registers of claim 1 comprising N boundary scan registers coupled in series.

3. The chain of boundary scan registers of claim 1 wherein a system clock signal is configured such that a relative delay between the first clock signal and the second clock signal is less than one-half the cycle time of the system clock signal.

4. The chain of boundary scan registers of claim 1 further comprising a first pulse signal generator configured to receive the first clock signal and to generate a first pulse signal in response to the rising edge of the first clock signal.

5. The chain of boundary scan registers of claim 4 further comprising a second pulse signal generator configured to receive the first clock signal and to generate a second pulse signal in response to the falling edge of the first clock signal.

6. The chain of boundary scan registers of claim 5 wherein the first boundary scan register comprises a first latch coupled to the first pulse signal generator and a second latch coupled to the second pulse signal generator.

7. The chain of boundary scan registers of claim 6 wherein the first latch is configured to receive the first pulse signal, to latch the first data value in response to the first pulse signal, and to output the first data value.

8. The chain of boundary scan registers of claim 7 wherein the second latch is coupled to the first latch and is configured to receive the second pulse signal, to latch the first data value output from the first latch in response to the second pulse signal, and to output the first data value.

9. The chain of boundary scan registers of claim 8 further comprising a third pulse signal generator configured to receive the second clock signal and to generate a third pulse signal in response to the rising edge of the second clock signal.

10. The chain of boundary scan registers of claim 9 further comprising a fourth pulse signal generator configured to receive the second clock signal and to generate a third pulse signal in response to the falling edge of the second clock signal.

11. The chain of boundary scan registers of claim 10 wherein the second boundary scan register comprises a third latch coupled to the third pulse signal generator and a fourth latch coupled to the fourth pulse signal generator.

12. The chain of boundary scan registers of claim 11 wherein the third latch is configured to receive the third pulse signal, to latch the first data value in response to the third pulse signal, and to output the first data value.

13. The chain of boundary scan registers of claim 12 wherein the fourth latch is coupled to the third latch and is configured to receive the fourth pulse signal, to latch the first data value output from the third latch in response to the fourth pulse signal, and to output the first data value.

14. A boundary scan register configured to input and output data according to a system clock signal, the boundary scan register comprising:
  a first pulse signal generator configured to receive the system clock signal and to generate a first pulse signal in response to a rising edge of the system clock signal;
  a second pulse signal generator configured to receive the system clock signal and to generate a second pulse signal in response to a falling edge of the system clock signal;
  a first latch coupled to the first pulse signal generator and configured to receive the first pulse signal, to latch an input data value in response to the first pulse signal forming a first latched data value, and to output the first latched data value; and
  a second latch coupled to the second pulse signal generator and configured to receive the second pulse signal, to latch the first latched data value output from the first latch in response to the second pulse signal forming a second latched data value, and to output the second latched data value.

15. A method of passing data through a chain of boundary scan registers, the method comprising:
  receiving a first clock signal at a first boundary scan register;
  receiving a second clock signal at a second boundary scan register, wherein the second clock signal is delayed relative to the first clock signal;
  latching a first input data value by the first boundary scan register at a rising edge of the first clock signal;
  preventing the first data value from being output from the first boundary scan register prior to a falling edge of the first clock signal;
  outputting the first data value from the first boundary scan register at the falling edge of the first clock signal;
  latching the first data value output from the first boundary scan register by the second boundary scan register, wherein latching by the second boundary scan register is performed at a rising edge of the second clock signal;
  preventing the first data value from being output from the second boundary scan register prior to a falling edge of the second clock signal; and
  outputting the first data value from the second boundary scan register at the falling edge of the second clock signal.

16. The method of claim 15 further comprising coupling N boundary scan registers together in series.

17. The method of claim 15 further comprising configuring a system clock signal such that a relative delay between the first clock signal and the second clock signal is less than one-half the cycle time of the system clock signal.

18. The method of claim 15 further comprising generating a first pulse signal in response to the rising edge of the first clock signal.

19. The method of claim 18 further comprising generating a second pulse signal in response to the falling edge of the first clock signal.

20. The method of claim 19 further comprising latching the first data value by a first latch in the first boundary scan register in response to the first pulse signal while preventing the first data value from being output from the first boundary scan register.

21. The method of claim 20 further comprising latching the first data value by a second latch in the first boundary scan register in response to the second pulse signal.

22. The method of claim 21 wherein outputting the first data value from the first boundary scan register comprises outputting the first data value from the second latch.

23. The method of claim 15 further comprising generating a third pulse signal in response to the rising edge of the second clock signal.

24. The method of claim 23 further comprising generating a fourth pulse signal in response to the falling edge of the second clock signal.

25. The method of claim 24 further comprising latching the first data value by a third latch in the second boundary scan register in response to the third pulse signal while preventing the first data value from being output from the second boundary scan register.

26. The method of claim 25 further comprising latching the first data value by a fourth latch in the second boundary scan register in response to the fourth pulse signal.

27. The method of claim 26 wherein outputting the first data value from the second boundary scan register comprises outputting the first data value from the fourth latch.

28. A method of passing an input data value through a boundary scan register, the method comprising:
  receiving a system clock signal;
  generating a first pulse signal in response to a rising edge of the system clock signal;
  latching the input data value in response to the first pulse signal at a first latch within the boundary scan register, while preventing the input data value from being output from the first latch;
  generating a second pulse signal in response to a falling edge of the system clock signal;
  latching the input data value in response to the second pulse signal at a second latch within the boundary scan register; and
  providing as an output the input data value from the boundary scan register.

* * * * *